United States Patent [19]

Kim et al.

[11] Patent Number: 4,556,448
[45] Date of Patent: Dec. 3, 1985

[54] METHOD FOR CONTROLLED DOPING OF SILICON CRYSTALS BY IMPROVED FLOAT ZONE TECHNIQUE

[75] Inventors: Kyong M. Kim, Hopewell Junction; Pavel Smetana, Poughkeepsie, both of N.Y.; Gunther H. Schwuttke, Scottsdale, Ariz.

[73] Assignee: International Business Machines Corporation, Armonk, N.Y.

[21] Appl. No.: 543,642

[22] Filed: Oct. 19, 1983

[51] Int. Cl.⁴ .............................................. C30B 13/10
[52] U.S. Cl. .................................... 156/605; 156/620
[58] Field of Search ............... 422/250; 156/605, 606, 156/620, DIG. 89

[56] References Cited

U.S. PATENT DOCUMENTS

| | | | |
|---|---|---|---|
| 3,141,848 | 7/1964 | Enk | 156/605 |
| 3,858,549 | 1/1975 | Keller | 118/49.1 |
| 3,908,586 | 9/1975 | Sporrer | 118/49.1 |
| 3,954,416 | 5/1976 | Keller | 156/605 |
| 4,044,730 | 6/1978 | Rahilly | 156/606 |
| 4,107,448 | 8/1978 | Stut | 13/26 |
| 4,220,839 | 9/1980 | DeLeon | 156/605 |
| 4,352,785 | 10/1982 | Schellin | 156/DIG. 98 |
| 4,400,232 | 8/1983 | Ownby et al. | 156/601 |

Primary Examiner—Hiram H. Bernstein
Attorney, Agent, or Firm—Henry E. Otto, Jr.

[57] ABSTRACT

An apparatus and method are described for incorporating doping material into a single silicon crystal by an improved float zone (FZ) crystal growth method. A solid fused silica doping rod is inserted into a floating zone of molten silicon in a controlled manner, preferably via a generally radial hole through a radio-frequency induction coil. Oxygen doping, in a concentration of 1–25 ppm, is achieved by using a fused silica doping rod. N- or p-type dopants may be contained in the silica rod as impurities to provide n- or p-type doping concurrently with the oxygen doping.

6 Claims, 5 Drawing Figures

METHOD FOR CONTROLLED DOPING OF SILICON CRYSTALS BY IMPROVED FLOAT ZONE TECHNIQUE

BACKGROUND OF THE INVENTION

This invention relates to doping of silicon single crystals, and relates more particularly to an improved float zone crystal growth apparatus and method for effecting controlled incorporation of doping materials, such as oxygen and/or n- or p-type dopants, into a silicon semiconductor crystal.

In the float zone (FZ) silicon crystal growth method, the silicon melt is not contained in a crucible. A single crystal is grown typically by moving a single-turn radio-frequency (rf) load coil upwardly in surrounding relation to and relative to a polycrystalline silicon feed rod. The coil transmits power directly into the silicon by induction heating at a frequency of about 2.4 MHz, creating a floating liquid pool of silicon that provides means to convert the polycrystalline silicon to monocrystalline silicon.

The silicon single crystals grown by this FZ method are doped by using gaseous sources during crystal growth. The gaseous dopants are diluted in an inert carrier gas such as argon and blown to the surface of the floating zone of the liquid silicon. This causes some of the gaseous dopants to be dissolved in the liquid in the float zone and as a result incorporated into the growing silicon crystal. The doping level is dependent upon the dopant concentration in the melt and its equilibrium segregation coefficient. Typically, phosphine $(PH_3)_2$ or arsine $(AsH_3)$ is used for n-type doping, and diborane for p-type doping.

With gas doping, the FZ method must be carried out in an inert gas ambient using a slight overpressure relative to the atmospheric pressure. Ionization and plasma formation of the inert gas between the two leads of the rf load coil occur frequently during crystal growth. This causes perturbation of the steady state crystal growth and results in polycrystalline formation, which degrades the yield and throughput of the FZ method. Furthermore, the dopant gases (phosphine, arsine and diborane) are very poisonous, and require strict precautions for safe handling.

Oxygen in silicon crystals has some beneficial effects on the wafer during large and very large scale integration (LSI and VLSI) device processing. Precipitates of oxygen can act as gettering centers of impurities and thus improve the minority carrier lifetime in the wafer. On the other hand, if the oxygen concentration is above a certain level in the silicon crystal, the minority carrier lifetime may degrade in the wafer during processing. Therefore, it is desirable to control the oxygen level in the silicon to an optimum level tailored for the particular device applications. Although FZ silicon crystals are of much higher purity than crystals grown by the widely used Czochralski (CZ) method, the low level of oxygen obtained using the conventional FZ silicon method has heretofore prevented its application to LSI/VLSI device processing.

U.S. Pat. Nos. 3,858,549; 3,908,586 and 4,107,448 disclose typical apparatus for n- or p-type doping of semiconductor materials, such as silicon, in the conventional FZ crystal growth method.

There is a need to provide an improved FZ silicon crystal growth apparatus and method which (a) enables FZ silicon crystals to be doped from a solid source rather than with poisonous dopant gases, as taught by the prior art; (b) enables oxygen doping of FZ crystals in a controlled manner to achieve oxygen concentrations as much as about ten times higher than in an undoped crystal and close to the oxygen concentrations obtained in silicon crystals grown by the Czochralski (CZ) method, thereby providing high purity FZ silicon crystals which are suitable for LSI/VLSI applications; (c) facilitates doping with n-and/or p-type dopants by enabling them to be provided in desired controlled amounts as resistivity impurities in a fused silica rod that provides the desired oxygen concentration in the FZ crystal; and (d) enables increased yields and throughputs of FZ crystals.

SUMMARY OF THE INVENTION

Toward this end, there is provided an improved apparatus for controlled incorporation of doping material into a semiconductor silicon crystal by the float zone (FZ) crystal growth method. This apparatus comprises conventional means for supporting and continuously rotating a rod of polycrystalline semiconductor silicon material. A single turn induction heating coil surrounds the rod and is operative, when energized, to locally melt the rod to create a liquid pool of silicon defining a molten float zone. The coil is moved upwardly relative to the rod to advance the heated float zone for progressively converting the structure of the rod from polycrystalline to monocrystalline.

According to a preferred embodiment of the invention, the rf coil has a hole that extends generally radially from the periphery to the center of the coil, and a solid doping rod consisting of fused silica is inserted into and guided through this hole into the molten float zone of the semiconductor rod to add dopant thereto according to the composition and geometry of the doping rod and the rate at which the doping rod is moved into the float zone. If preferred, however, the solid doping rod may be suitably moved into the float zone above or below, but adjacent to, the coil.

BRIEF DESCRIPTION OF THE DRAWINGS

The invention will now be described with reference to the accompanying drawing, wherein.

DESCRIPTION OF THE PREFERRED EMBODIMENT—FIGS. 1–3

Figure 1:
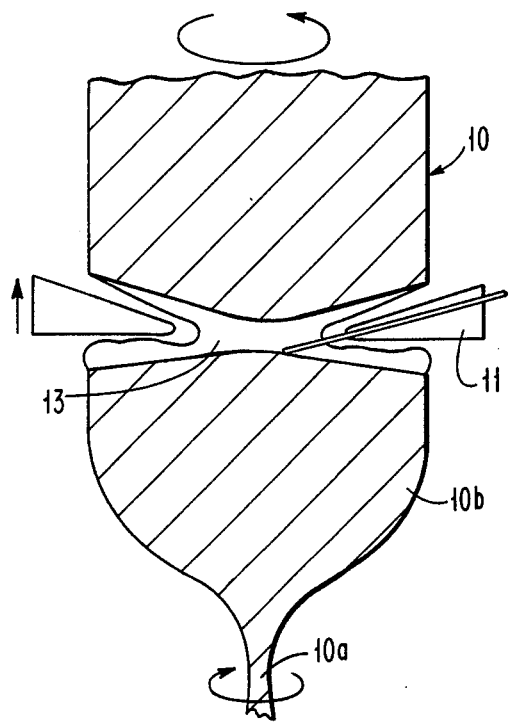
FIG. 1 is a partial schematic view illustrating the environment and manner of operation of the apparatus and method embodying the invention.

As in the conventional state-of-the-art FZ silicon crystal growth method, a polycrystalline silicon rod 10 is supported at one end and rotated continuously by suitable means (not shown). A single-turn radio-frequency (rf) annular coil surrounds rod 10, initially at a seed area 10a.

Coil 11 is operative, when energized via coil leads 12 (FIG. 2), to inductively heat and locally melt rod 10, thereby creating a zone 13 of molten semiconductor silicon material. This zone, termed a "float zone", is moved upwardly relative to the rotating rod 10, in conventional manner, by suitable means (not shown) when a single crystal silicon is seeded to the tip of the molten silicon pool. This relative movement may be effected by moving coil 11 upward along rod 10 or, if preferred, pulling the rod downwardly through the coil. In either event, as the float zone 13 is advanced upwardly relative to rod 10, the structure of the rod in the area 10b between seed area 10a and the float zone is changed from polycrystalline to monocrystalline.

Coil 11 is supported on a mounting block 14 which provides a bore 15 open to a source 16 of water or other coolant. Bore 15 communicates via a tube 17 with an annular channel 18 formed within the periphery of the coil so that the coolant may be supplied to and circulated around channel 18 to prevent overheating of the coil. It should be noted that the source 16 also includes the rf power supply.

Figure 2:
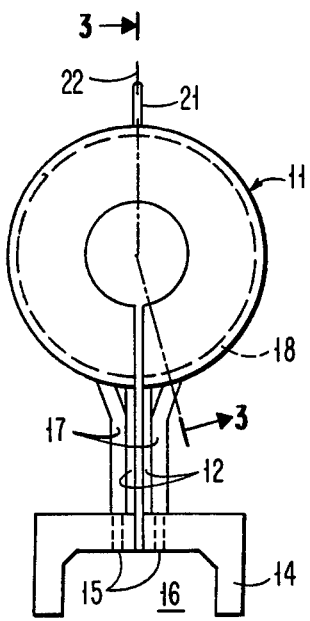
FIG. 2 is a front view, to enlarged scale, of an rf coil of modified construction according to the invention.
Figure 3:
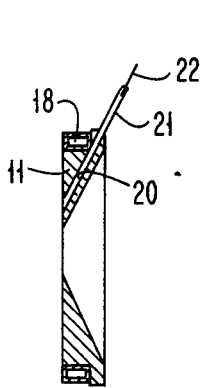
FIG. 3 is a sectional view taken along the line 3—3 of FIG. 2.

According to the invention, and as illustrated in FIGS. 1–3, the annular, single-turn coil 11 has a generally triangular wedge-shaped cross section, and a hole 20 is drilled radially through the coil adjacent the long dimension side thereof and hence at an acute angle to the plane of the coil. Hole 20 is preferably coaxially aligned with the bore in a hollow ground stud 21, thereby desirably maintaining the voltage at the hole substantially at ground level.

A solid doping rod 22, preferably about 3 mm in diameter, is inserted with slight clearance through the stud 21 and hole 20 into the float zone 13 of liquid silicon. Rod 22 is of fused silica to provide oxygen doping. Or, if desired, a fused silica rod 22 containing controlled amounts of n-type dopants (e.g., phosphorous or arsenic) and/or p-type dopants (e.g., boron) may be used. Fused silica is highly soluble in liquid silicon and any n- or p-type dopants will be readily dissolved along with the fused silica rod. Since there is vigorous fluid flow in float zone 13, the dissolved dopants will be thoroughly mixed throughout the molten silicon and then uniformly incorporated in the monocrystalline area 10b.

The equilibrium segregation coefficient (ko) of oxygen in silicon is relatively high (1.25). Hence, an oxygen concentration of 2 parts per million (ppm) in the silicon melt will result in about $1 \times 10^{17}$ atoms/cm$^3$ in the FZ silicon crystal. By varying the diameter of the fused silica rod 22 and/or the rate at which it is moved into the molten silicon in the float zone 13, the oxygen level in the FZ monocrystalline area 10b can be very accurately controlled to provide oxygen concentrations of 1 to 25 ppm.

In actual test, oxygen concentration and resistivity of two FZ silicon crystals were measured using infrared (IR) techniques and a four-point probe, with the results tabulated below:

|  | A<br>Conventional<br>FZ Crystal | B<br>Applicants' Solid<br>Rod Doped FZ Crystal |
|---|---|---|
| Oxygen level |  |  |
| as ppm | 0.3 | 2.5 |
| as atoms/cm$^3$ | $1.5 \times 10^{16}$ | $1.3 \times 10^{17}$ |
| Resistivity (ohm/cm) | 460, n-type | 5.0, p-type |

Crystal A was grown by the conventional FZ silicon crystal growth method, as described in the above-cited prior art, using gaseous doping; whereas crystal B was grown using applicants' improved apparatus and method incorporating the solid doping rod 22. These test results demonstrate that incorporation of oxygen and resistivity doping of FZ silicon crystals are reliably achieved by applicants' technique employing a solid doping rod 22 in a vacuum atmosphere. Note that the oxygen level in crystal B is about ten times higher than that in crystal A, enabling oxygen concentrations, if desired, close to those present in CZ crystals to be provided in a controlled way in FZ crystals.

MODIFIED EMBODIMENTS—FIGS. 4 AND 5

Figure 4:
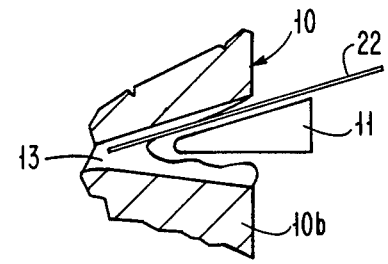
FIGS. 4 and 5 are fragmentary views showing modified embodiments of the apparatus and method embodying the invention.
Figure 5:
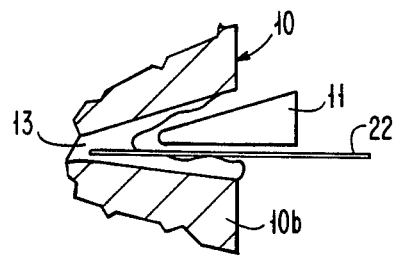

As illustrated in FIGS. 4 and 5, the solid doping rod may be inserted above or below, respectively, the rf coil, if preferred, in lieu of having the rod inserted through and supported by the stud 21 and coil 11. In such event, suitable means (not shown) would have to be provided to support as well as advance the doping rod 22 into the float zone 13.

It will be seen that the apparatus and method herein described and employing a solid source doping rod 22 enables n- or p-type crystals to be grown under high vacuum and in a carefully controlled manner. This increases the yield and throughput of the FZ process by substantially eliminating the adverse effect of the ionization and plasma formation encountered in the conventional FZ method employing gas source doping. Moreover, solid source doping is considerably safer than gas source doping which generally employs poisonous gases, such as phosphine, arsine and diborane, that need elaborate and costly precautions for safe handling.

While the invention has been shown and described with reference to preferred embodiments thereof, it will be understood by those skilled in the art that changes in form and detail may be made therein without departing from the spirit, scope and teaching of the invention. Accordingly, the apparatus and method herein disclosed are to be considered merely as illustrative and the invention is to be limited only as specified in the claims.

We claim:

1. A method for controlling the incorporation of doping material into a semiconductor crystal, comprising the steps of:
   supporting and rotating a rod of polycrystalline semiconductor material;
   providing an inductive heating coil surrounding the rod;
   energizing the coil to locally melt the rod while concurrently moving the coil and rod relative to each other to create a floating zone of molten semiconductor material; and
   moving a solid doping rod containing fused silica into said zone and toward the center of the first-mentioned rod to dope the first-mentioned rod with oxygen in a controlled manner according to the composition and cross-section of the doping rod and the rate at which it is moved into the zone, thereby to convert the polycrystalline semiconductor material to a monocrystalline semiconductor material having an accurately controlled selectable oxygen concentration.

2. A method according to claim 1, including the step of supporting the doping rod during the moving step by inserting it with slight clearance into said zone via a generally radial hole extending through the coil.

3. A method according to claim 1, including the step of supporting the doping rod during the moving step by inserting it with slight clearance into said zone via a hollow electrically grounded stud and an aligned hole through the coil.

4. A method according to claim 1, wherein the doping rod is moved into said zone adjacent the coil.

5. The method according to claim 1, wherein the oxygen concentration is controlled at a selected concentration of between 1 and 25 ppm.

6. The method according to claim 1, wherein said doping rod contains, in addition to fused silica, controlled amounts of n-type or p-type dopants, for concurrently doping said first-mentioned rod with oxygen and said dopants.

* * * * *